United States Patent [19]

Zaderej et al.

[11] Patent Number: 4,562,366
[45] Date of Patent: Dec. 31, 1985

[54] IN-LINE SOLID STATE TIME DELAY DEVICE

[76] Inventors: Andrew Zaderej; Andrew J. Zaderej, both of 4016 N. Home St., Mishawaka, Ind. 46545

[21] Appl. No.: 336,284

[22] Filed: Dec. 31, 1981

[51] Int. Cl.[4] .................. H03K 5/159; H03K 17/60
[52] U.S. Cl. .................. 307/599; 307/252 J; 307/252 N
[58] Field of Search .......... 307/599, 598, 252 J, 307/252 N, 252 W, 284

[56] References Cited

U.S. PATENT DOCUMENTS

| | | | |
|---|---|---|---|
| 3,131,318 | 4/1964 | Snyder et al. | 307/252 J |
| 3,313,997 | 4/1967 | Pinckaers | 307/284 |
| 3,377,125 | 4/1968 | Zielinski | 307/252 W |
| 3,404,291 | 10/1968 | Green et al. | 307/599 |
| 3,417,296 | 12/1968 | Wallentowitz | 307/599 |
| 3,846,644 | 11/1974 | Takagi et al. | 307/252 J |

*Primary Examiner*—Stanley D. Miller
*Assistant Examiner*—B. P. Davis
*Attorney, Agent, or Firm*—James D. Hall

[57] ABSTRACT

A two-terminal in-line time delay device incorporating upon the initiation of in-put power into the device a pulsing component which, after a selected time delay, provides a gating pulse for a line-to-load series connected SCR. As the SCR is switched on, a connected transistor is turned on to provide a continuous gating current for the SCR which allows load-to-line current flow.

6 Claims, 1 Drawing Figure

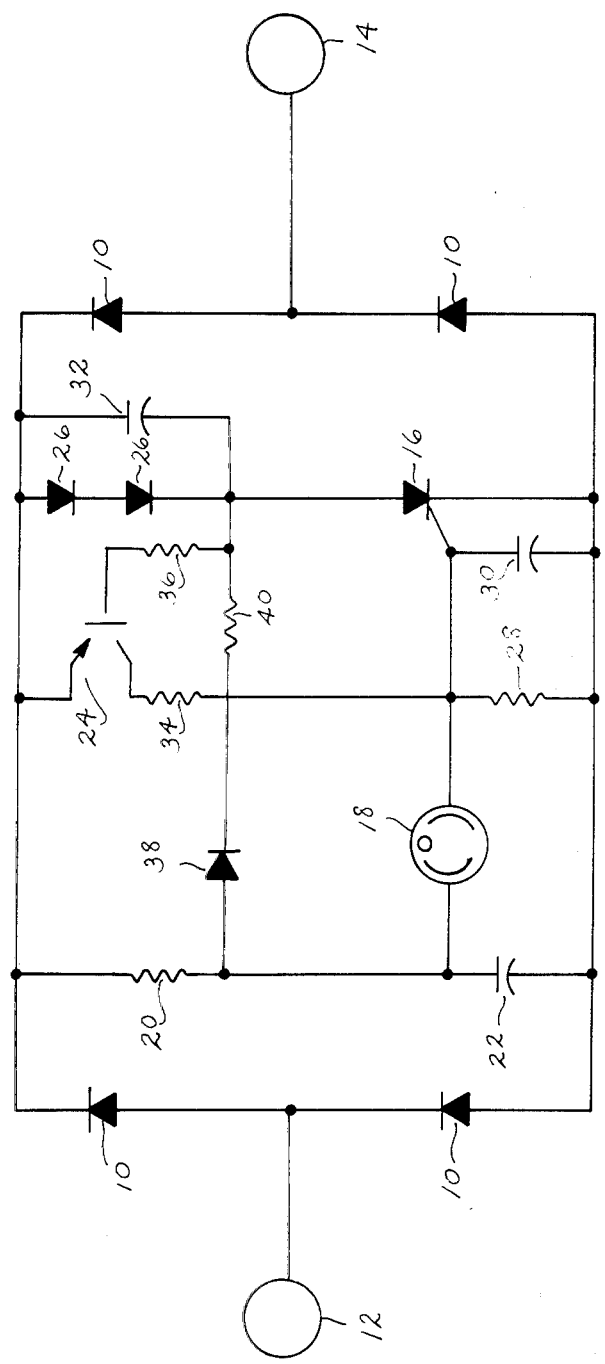

IN-LINE SOLID STATE TIME DELAY DEVICE

SUMMARY OF THE INVENTION

This invention relates to a time delay device and will have specific application to a solid state two-terminal in-line device.

In this invention the time delay device does not require a power supply from an external source and includes two terminals which permits its in-line connection between a power source and a load. Upon power turn on and after a selected time delay, an in-line power to load connected SCR is switched on by an initial pulse. Simultaneously a transistor connected to the gate of the SCR is biased and latched on to maintain the SCR in its activated current conducting mode. The SCR remains in its conducting mode until the power to the time delay device is turned off at which time the device resets itself for another time delay operation upon power turn on.

The time delay device is of compact construction and of highly reliable operation. The device can be utilized separately or in combination with relays to create many different variations and combinations of controls for industrial application, such as igniter controls, motor controls, liquid level controls, and synchronization of input-output controls.

Accordingly, it is the object of this invention to provide an in-line time delay device which does not require an external power source.

Another object of this invention is to provide a solid state in-line time delay device which is of compact size and of reliable operation.

Another object of this invention is to provide a time delay device which is of high accuracy and of repeated reliable operation.

Other objects of this invention become apparent upon the reading of the following description.

DESCRIPTION OF THE DRAWING

A circuit diagram of the preferred embodiment is shown.

DESCRIPTION OF THE PREFERRED EMBODIMENT

The preferred embodiment illustrated is not intended to be exhaustive or to limit the invention to the precise form disclosed. It is chosen and described to best explain the principles of the invention and its application and practical use to enable others skilled in the art to best utilize the invention.

The circuit illustrated in adapted to be connected at terminal 12 or 14 to an AC power source, such as a normal 110 or 220-volt, 60 or 50 Hz line. The other terminal would be connected to a suitable load. Diodes 10 constitute a rectifier bridge by which a rectified full wave current passes through the components of the device. Terminals 12 and 14 into the rectifier bridge serve to connect the time delay device between a suitable power supply and a load in an in-line manner. It is to be understood that the time delay components of the device can be utilized with a DC power source in which case the bridge rectifier components, diodes 10, would not be utilized.

An SCR 16 is connected between terminal 12 and terminal 14 within the rectifier bridge. A neon bulb 18, such as a NE-2 type, is connected at one lead to the gate of SCR 16. The opposite lead of bulb 18 is connected to a resistor 20 and a capacitor 22 which form an RC sub-circuit.

A PNP transistor 24 is connected at its emitter and collector between the gate of SCR 16 and terminal 12 through the rectifier bridge. The base of transistor 24 is connected to the anode of SCR 16. A pair of biasing diodes 26 are connected between terminal 12 through the rectifier bridge and the anode of SCR 16 in parallel with the base-emitter junction of transistor 24. Resistor 28 provides a bias for SCR 16.

Upon the application of current through terminal 12, capacitor 22 is charged for a specific length of time until the threshold level of neon bulb 18 is reached. The rate of charging of capacitor 22 is determined by resistor 20 of the RC sub-circuit. This period of time required for capacitor 22 to reach the threshold of bulb 18 is representative of the time delay and can be for a selected duration, such as from a fraction to one hour after power turn on. Once the threshold potential of neon bulb 18 is reached at capacitor 22, the bulb will produce a pulsed discharge current which triggers or gates SCR 16, turning the SCR on. At the instant SCR 16 is turned on through the pulsed current of neon bulb 18, a potential is created across diodes 26 which turns on transistor 24. Transistor 24 is latched in its on mode, allowing current to pass through its emitter-collector junction to the gate of SCR 16. This causes SCR 16 to remain switched on as long as the power to terminal 12 remains on.

Upon the switching of SCR 16, current passes through the time delay device and to the load. There is an extremely low potential drop between terminals 12 and 14 during this time. Current will continue to pass between terminals 12 and 14 as long as power is supplied to terminal 12. Once power is terminated at terminal 12, the SCR 16 will be switched off and the time delay device will reset for its next timing cycle upon power turn on again.

Capacitor 30 connected in parallel with biasing resistor 28 filters the gate current to SCR 16 in order to prevent false triggering. Capacitor 32 connected in parallel with biasing diodes 26 at transistor 24 serves to filter the rectified current in order to produce a truer DC signal for the transistor. Resistor 34 connected to the collector of transistor 24 and resistor 36 connected to the base of the transistor serve to bias the transistor when in its on or active mode.

Upon emission of the current pulse by neon bulb 18, capacitor 22 discharges in preparation for the next power turn on. The discharge current of capacitor 22 passes through connected diode 38 and series-connected resistor 40 which in turn is connected to the anode of SCR 16. Resistor 40 serves to limit the discharge current of capacitor 22 in order to protect SCR 16.

It is to be understood that the invention is not to be limited to the details above given but may be modified within the scope of appended claims.

What we claim is:

1. An in-line electrical time delay device comprising an SCR means connected at its anode and cathode between first and second terminal leads for providing a current path when switched on between said leads, said leads adapted for in-line connection between a power source and a load, a pulsing means connected between said first lead and the gate of said SCR means responsive to a selected time delay upon power source turn on for providing a triggering pulse upon termination of said selected time delay to switch on said SCR means, a transistor having its emitter-collector junction connected between said first lead and said SCR means gate and its base-emitter junction connected between said first lead and said SCR means at one of its anode and cathode, said SCR means when initially switched on by said triggering pulse for providing a bias across said transistor base-emitter junction to turn said transistor on, wherein said transistor when turned on will cause said SCR means to remain switched on.

2. The device of claim 1 wherein said pulsing means includes a resistor and capacitor in series with said first lead and a neon bulb connected in series with said capacitor and said SCR means gate, wherein said neon bulb provides a gating pulse to said SCR means when said capacitor reaches a predetermined charge after a power source turn on.

3. The device of claim 2 and conductive means extending from said capacitor at the side of its neon bulb connection to said SCR means at the side of its one anode and cathode transistor connection for providing a discharge loop for the capacitor.

4. The device of claim 1 and a bridge circuit means between said leads to provide full wave rectification of said power source for said SCR means and pulsing means and transistor.

5. A method of creating an electrical time delay in an in-line connection between a power source and a load comprising the steps:
   a. providing a pulsed signal after a selected time delay upon power source turn-on,
   b. directing said pulsed signal to the gate of an SCR connected at its anode and cathode between said leads to switch said SCR on and thereby provide a current path between such leads,
   c. providing a bias across a transistor connected between one of said leads and said SCR in response to said SCR switching on to turn said transistor on, and
   d. producing a signal at the gate of said SCR in response to said transistor turn on to cause said SCR to remain switched on in its active mode until power source turn-off.

6. The time-delay method of claim 5 wherein said power source is AC, and including the step of passing said AC through said SCR when switched on in response to said transistor turn on.

* * * * *